United States Patent
Ko

(10) Patent No.: US 8,917,110 B2
(45) Date of Patent: Dec. 23, 2014

(54) SEMICONDUCTOR PACKAGE INCLUDING MULTIPLE CHIPS AND MEMORY SYSTEM HAVING THE SAME

(75) Inventor: Jae-Bum Ko, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/603,112

(22) Filed: Sep. 4, 2012

(65) Prior Publication Data
US 2013/0162287 A1   Jun. 27, 2013

(30) Foreign Application Priority Data
Dec. 21, 2011 (KR) .................. 10-2011-0139601

(51) Int. Cl.
H03K 17/16 (2006.01)
H03K 19/003 (2006.01)
G11C 7/10 (2006.01)

(52) U.S. Cl.
USPC ....................... 326/30; 365/189.05

(58) Field of Classification Search
USPC ................ 326/30; 365/227, 229, 189.05, 191
See application file for complete search history.

(56) References Cited

U.S. PATENT DOCUMENTS

| | | | |
|---|---|---|---|
| 6,308,232 B1 * | 10/2001 | Gasbarro | 710/100 |
| 6,535,047 B2 * | 3/2003 | Mughal et al. | 327/378 |
| 6,687,780 B1 * | 2/2004 | Garlepp et al. | 710/305 |
| 7,222,209 B2 * | 5/2007 | Garlepp et al. | 710/305 |
| 8,598,905 B2 * | 12/2013 | Oh | 326/30 |
| 2009/0198924 A1 * | 8/2009 | Shaeffer et al. | 711/154 |
| 2010/0277210 A1 | 11/2010 | Wang et al. | |
| 2011/0316580 A1 * | 12/2011 | McCall et al. | 326/30 |
| 2012/0169370 A1 * | 7/2012 | Oh | 326/30 |
| 2014/0063990 A1 * | 3/2014 | KU et al. | 365/189.17 |

FOREIGN PATENT DOCUMENTS

KR   1020080030330   4/2008

* cited by examiner

*Primary Examiner* — Dylan White
(74) *Attorney, Agent, or Firm* — IP & T Group LLP

(57) ABSTRACT

A package includes a master chip including a storage circuit configured to store an impedance setting of the master chip and an impedance setting of a slave chip, and a termination circuit for an impedance matching with an outside of the package, and the slave chip connected to the master chip, wherein if a termination operation for the slave chip is activated, the termination circuit of the master chip performs an impedance matching operation using the impedance setting for the slave chip.

18 Claims, 6 Drawing Sheets

ND MEMORY SYSTEM# SEMICONDUCTOR PACKAGE INCLUDING MULTIPLE CHIPS AND MEMORY SYSTEM HAVING THE SAME

CROSS-REFERENCE TO RELATED APPLICATIONS

The present application claims priority of Korean Patent Application No. 10-2011-0139601, filed on Dec. 21, 2011, which is incorporated herein by reference in its entirety.

BACKGROUND

1. Field

Exemplary embodiments of the present invention relate to a semiconductor package, and more particularly, to a semiconductor package including multiple chips.

2. Description of the Related Art

Recently, the necessity of semiconductor devices capable of storing a large amount of data or processing a large amount of data in a short time. In addition, semiconductor devices that are capable of performing various functions have gradually increased. Accordingly, semiconductor devices are fabricated according to a method of stacking a plurality of chips performing the same function or different functions in one semiconductor package.

FIG. 1 is a diagram explaining an impedance matching operation in a package including a plurality of chips.

Referring to FIG. 1, an integrated circuit system includes a controller chip 110 and a semiconductor package 120 including a plurality of chips 121 to 124.

The controller chip 110 serves as a controller to control the plurality of chips 121 to 124 provided in the package 120. The plurality of chips 121 to 124 refer to chips, which perform specific operations based on the control of the controller chip 110. For example, the controller chip 110 may include a memory controller, and each of the chips 121 to 124 may include a memory.

Between the controller chip 110 and the package 120, an I/O channel I/O CHANNEL is provided to transmit and receive signals (data). The I/O channel I/O CHANNEL is connected to all of the chips 121 to 124, and each of the chips 121 to 124 exchanges signals with the controller chip 110 through the I/O channel I/O CHANNEL. FIG. 1 illustrates that the I/O channel I/O CHANNEL consists of N lines.

Chip select signals CS0 to CS3 are allocated to the plurality of chips 121 to 124 in the package 120, respectively. Each of the chip select signals CS0 to CS3 decides which chip is to exchange signals with the controller chip 110 among the plurality of chips 121 and 124. For example, while the chip select signal CS2 is activated, the chip 123 transmits and receives signals through the I/O channel I/O CHANNEL based on the control of the controller chip 110.

The respective chips 121 and 124 store their impedance settings therein, and include termination circuits 141 to 144 provided therein, respectively. The termination circuits 141 to 144 are configured to terminate the I/O channel I/O CHANNEL to the stored impedance settings to have an impedance matching. The termination operations of the termination circuits 141 to 144 are performed when the termination signals ODT0 to ODT3 allocated to the respective chips 121 to 124 are activated. The plurality of chips 121 to 124 may have different impedance settings, and the termination operations of the respective chips 121 to 124 may be performed at the same time. For example, the impedance setting of the chip 121 may be set to 60Ω, and the impedance setting of the chip 122 may be set to 120Ω. When the termination signal ODT0 is activated, the termination circuit 141 of the chip 121 terminates the I/O channel I/O CHANNEL to 60Ω, and when the termination signal ODT1 is activated, the termination circuit 142 of the chip 122 terminates the I/O channel I/O CHANNEL to 120Ω. Furthermore, when the termination signal ODT0 and the termination signal ODT1 are activated at the same time, the termination circuits 141 and 142 of the chips 121 and 122 terminate the I/O channel I/O CHANNEL at the same time. Therefore, the I/O channel I/O CHANNEL is terminated to 40Ω, which is a parallel impedance value of 60Ω and 120Ω.

That is, when the I/O channel I/O CHANNEL is connected to the respective chips 121 to 124 in the package 120 and the termination circuits 141 to 144 are provided in the respective chips 121 to 124 as illustrated in FIG. 1, the controller chip 110 may set different impedance values for the respective chips 121 to 124, and the number of chips whose termination operations are enabled may be controlled by selecting chips whose termination operations are enabled among the plurality of chips. Accordingly, it is possible to freely control the impedance value to which the I/O channel I/O CHANNEL is terminated.

SUMMARY

Exemplary embodiments of the present invention are directed to a technology for differently setting or freely controlling termination impedance values of a master chip and a slave chip, when the master chip and the slave chip are provided in a package.

In accordance with an exemplary embodiment of the present invention, a package includes a master chip including a storage circuit configured to store an impedance setting of the master chip and an impedance setting of a slave chip, and a termination circuit for an impedance matching between an inside and an outside of the package, and the slave chip connected to the master chip, wherein if a termination operation for the slave chip is activated, the termination circuit of the master chip performs an impedance matching operation using the impedance setting for the slave chip.

If a termination operation for the master chip is activated, the termination circuit of the master chip may perform an impedance matching operation using the impedance setting of the master chip. Furthermore, the master chip may further include an impedance control circuit configured to receive the impedance setting of the master chip or the impedance setting of the slave chip and to generate an impedance value, where the termination operation for the master chip and the termination operation for the slave chip are activated at the same time, the termination circuit of the master chip performs an impedance matching operation using the impedance value generated by the impedance control circuit.

In accordance with another exemplary embodiment of the present invention, a package includes a master chip including a storage circuit configured to store an impedance setting of the master chip and impedance settings of a plurality of slave chips, and a termination circuit for an impedance matching with an outside of the package, and the plurality of slave chips connected to the master chip, wherein if a termination operation for one slave chip among the plurality of slave chips is activated, the termination circuit of the master chip performs an impedance matching operation using the impedance setting for the slave chip.

If a termination operation of the master chip is activated, the termination circuit of the master performs an impedance matching operation using the impedance setting of the master chip. Furthermore, the master chip may further include an impedance control circuit configured to receive the impedance setting of the master chip and the impedance settings of the slave chips and to generate an impedance value obtained by computing impedance values of the chips, whose termination operations are activated. If termination operations for two or more chips are activated at the same time, the termination circuit of the master chip may perform an impedance matching operation using the impedance value generated by the impedance control circuit.

In accordance with yet another exemplary embodiment of the present invention, a package includes a master chip, a slave chip, and a channel configured to interface the master chip and the slave chip. The master chip includes a storage circuit configured to store an I/O parameter for the master chip and an I/O parameter for the slave chip, and a receiving/transmitting circuit configured to receive/transmit data of the master chip and data of the slave chip, transferred through the channel, to/from the outside of the package. The receiving/transmitting circuit receives/transmits data using the I/O parameter for the slave chip, when receiving/transmitting the data of the slave chip to/from the outside of the package.

In accordance with still another embodiment of the present invention, a memory system includes a memory controller, a memory package including a master memory chip, a slave memory chip, and an internal channel for interfacing the master memory chip and the slave memory chip, a data channel between the memory controller and the memory package, and a control channel between the memory controller and the memory package. The master memory chip includes a storage circuit configured to store an impedance setting of the master memory chip and an impedance setting of the slave memory chip, and a termination circuit configured to terminate the data channel for an impedance matching operation. If the memory controller activates a termination operation of the slave memory chip, the termination circuit of the master memory chip terminates the data channel for the impedance matching operation for the slave memory chip.

DETAILED DESCRIPTION

Figure 1:
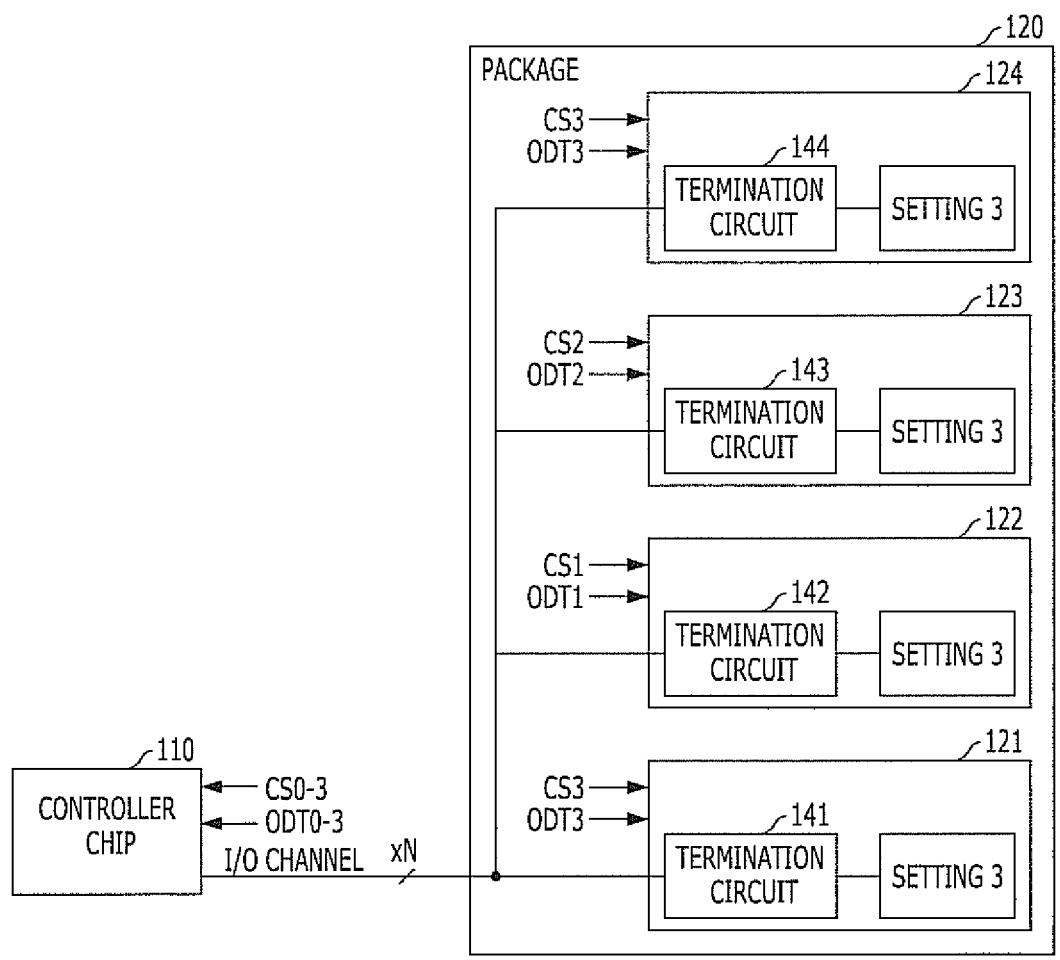
FIG. 1 is a diagram explaining an impedance matching operation in a package that includes a plurality of chips.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
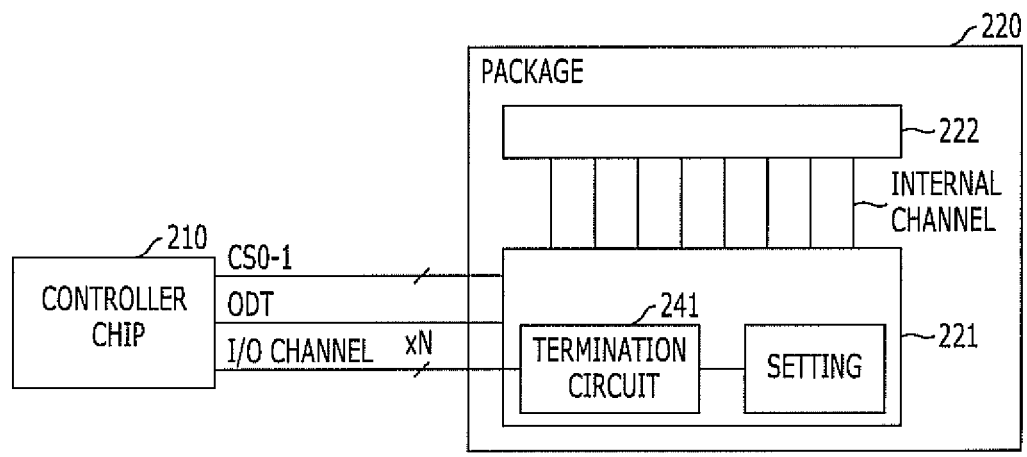
FIG. 2 is a diagram explaining an impedance matching operation in a package including a master chip and a slave chip therein.

FIG. 2 is a diagram explaining an impedance matching operation in a package including a master chip and a slave chip 222 therein.

Referring to FIG. 2, an integrated circuit system includes a controller chip 210 and a semiconductor package 220 that has a master chip 221 and a slave chip 222.

The controller chip 210 serves as a controller to control the chips 221 and 222 provided in the package 220. The chips 221 and 222 perform specific operations based on the control of the controller chip 210. For example, the controller chip 210 may include a memory controller, and each of the chips 221 and 222 may include a memory.

The chips 221 and 222 in the package 220 are not identical chips, and are divided into the master chip 221 and the slave chip 222. The master chip 221 directly exchanges signals (data) with the outside of the package 220 (for example, controller), but the slave chip 222 does not directly exchange signals with the outside of the package 220. The slave chip 222 exchanges signals with the outside of the package 220 through the master chip 221. The slave chip 222 and the master chip 221 are interfaced through an internal channel INTERNAL CHANNEL in the package 220. As illustrated in FIG. 2, the slave chip 222 may be stacked over the master chip 221, and the internal channel INTERNAL CHANNEL interfacing the slave chip 222 and the master chip 221 may be formed with a through-silicon via (TSV).

Between the controller chip 210 and the package 220, an I/O channel I/O CHANNEL is provided to transmit and receive signals. The I/O channel I/O CHANNEL is connected only to the master chip 221 of the chips 221 and 222 in the package 220. The master chip 221 directly communicates with the controller chip 210 and performs a communication between the slave chip 222 and the controller chip 210 through the I/O channel I/O CHANNEL.

The master chip 221 stores its impedance setting therein, and includes a termination circuit configured to terminate the I/O channel I/O CHANNEL to the stored impedance setting to achieve an impedance matching. The termination operation is performed when a termination signal ODT, which is inputted to the master chip 221, is activated. The slave chip 222 neither stores an impedance setting therein, nor includes a termination circuit provided therein. That is, because the slave chip 222 is not connected to the I/O channel I/O CHANNEL, it is impossible for the slave chip 222 to perform an impedance matching operation of the I/O channel I/O CHANNEL.

When the I/O channel I/O CHANNEL is connected only to the master chip 221 in the package 220 as illustrated in FIG. 2, the controller chip 210 may change a termination impedance value for the I/O channel I/O CHANNEL only by changing the impedance setting of the master chip 221. As in the conventional package illustrated in FIG. 1, a chip to perform a termination operation may be changed, or a plurality of chips in the package may be controlled to perform termination operations at the same time. In this case, however, it is possible to change the impedance value for the I/O channel I/O CHANNEL. That is, when the I/O channel I/O CHANNEL is connected only to the master chip 221 in the package 220 as illustrated in FIG. 2, the diversity may lack in changing the termination impedance value for the I/O channel I/O CHANNEL. Furthermore, the controller chip 110 operating with the package 120 of FIG. 1 cannot operate for compatibility with the package 220 of FIG. 2, and the controller chip 210 operating with the package 220 of FIG. 2 should be designed in a totally different manner.

Therefore, there is a demand for a package that supports freely changing an impedance value for termination and is compatible with the conventional controller chip 110.

Figure 3:
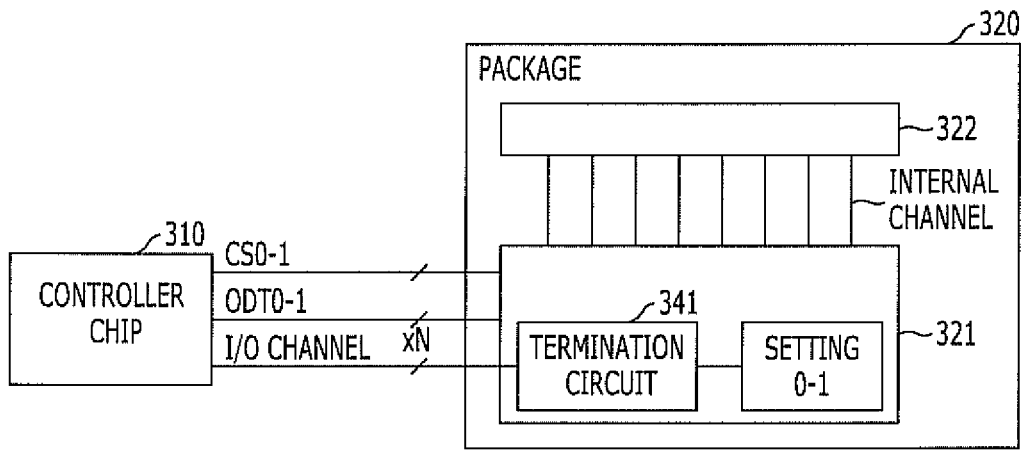
FIG. 3 is a configuration diagram of an integrated circuit system in accordance with an embodiment of the present invention.

FIG. 3 is a configuration diagram of an integrated circuit system in accordance with an embodiment of the present invention.

Referring to FIG. 3, the integrated circuit system includes a controller chip 310 and a semiconductor package 320 that has a master chip 321 and the slave chip 322.

The controller chip 310 serves as a controller to control the chips 321 and 322 in the package 320. The chips 321 and 322 perform specific operations based on the control of the controller chip 310. For example, the controller chip 310 may include a memory controller, and each of the chips 321 and 322 may include a memory. The controller chip 310 operates in the same manner as the controller chip 110 of FIG. 1, when controlling a termination impedance value for an I/O channel.

The chips 321 and 322 in the package 320 are not identical chips, and are divided into the master chip 321 and the slave chip 322. The master chip 321 directly exchanges signals (data) with the outside of the package 320 (for example, controller), but the slave chip 322 does not directly exchange signals with the outside of the package 320. The slave chip 322 exchanges signals with the outside of the package 320 through the master chip 321. The slave chip 322 and the master chip 321 are interfaced through an internal channel INTERNAL CHANNEL in the package 320. As illustrated in FIG. 3, the slave chip 322 may be stacked over the master chip 321, and the internal channel INTERNAL CHANNEL interfacing the slave chip 322 and the master chip 321 may be formed with a TSV. Between the master chip 321 and the slave chip 322, a chip to exchange signals with the controller chip 310 is selected by a chip select signal CS0 or CS1. When the chip select signal CS0 is activated, the master chip 321 exchanges signals with the controller chip 310. When the chip select signal CS1 is activated, the slave chip 322 exchanges signals with the controller chip 310.

Between the controller chip 310 and the package 320, an I/O channel I/O CHANNEL is provided to transmit and receive signals. The I/O channel I/O CHANNEL is connected only to the master chip 321 of the chips 321 and 322 in the package 320. The master chip 321 directly communicates with the controller chip 310 and performs a communication between the slave chip 322 and the controller chip 310 through the I/O channel I/O CHANNEL.

The master chip 321 stores both an impedance setting of the master chip 321 and an impedance setting of the slave chip 322. When a termination operation of the master chip 321 is indicated, that is, when a termination signal ODT0 is activated, the termination circuit 341 of the master chip 321 terminates the I/O channel I/O CHANNEL to the impedance setting of the master chip 321. Furthermore, when a termination operation of the slave chip 322 is indicated, that is, when a termination signal ODT1 is activated, the termination circuit 341 of the master chip 321 terminates the I/O channel I/O CHANNEL to the impedance setting of the slave chip 322. Furthermore, when the termination operation of the master chip 321 and the termination operation of the slave chip 322 are indicated at the same time, that is, when the termination signals ODT0 and ODT1 are activated at the same time, the termination circuit 341 of the master chip 321 terminates the I/O channel I/O CHANNEL to an impedance value obtained by parallel computing the impedance setting of the master chip 321 and the impedance setting of the slave chip 322.

In accordance with the exemplary embodiment of FIG. 3, only the master chip 321 performs a termination operation on the I/O channel I/O CHANNEL. However, the master chip 321 may terminate the I/O channel I/O CHANNEL to the impedance setting of the master chip 321, may terminate the I/O channel I/O CHANNEL to the impedance setting of the slave chip 322, or may terminate the I/O channel I/O CHANNEL to the parallel impedance value of the impedance setting of the master chip 321 and the impedance setting of the slave chip 322.

Figure 4:
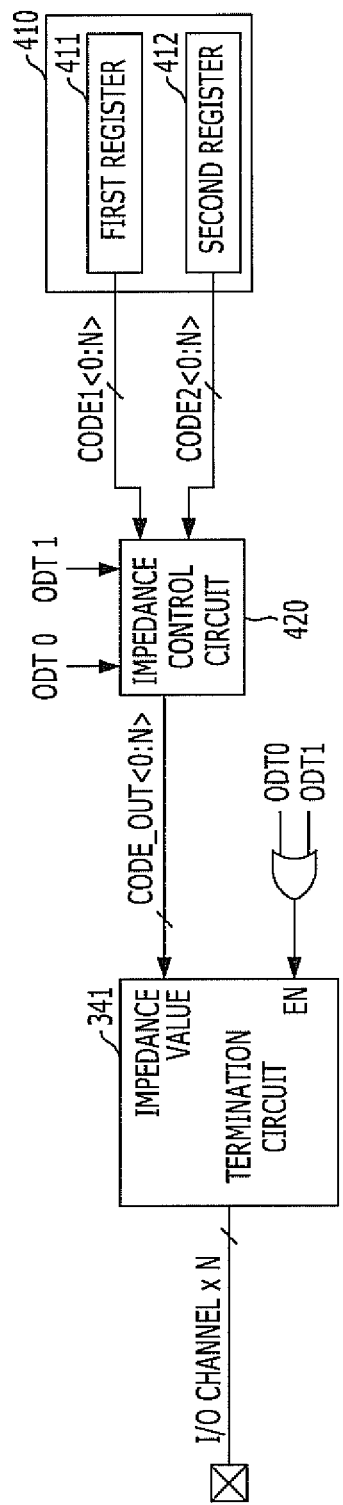
FIG. 4 is a diagram explaining a termination operation of a master chip of FIG. 3.

FIG. 4 is a diagram explaining the termination operation of the master chip 321 of FIG. 3.

Referring to FIG. 4, the master chip 321 includes a storage circuit 410, an impedance control circuit 420, and a termination circuit 341.

The storage circuit 410 is configured to store the impedance setting of the master chip 321 and the impedance setting of the slave chip 322. The storage circuit 410 includes a first register 411 configured to store the impedance setting of the master chip 321. The impedance setting of the master chip 321, stored in the first register 411, may be set by decoding signals, which are inputted to the I/O channel I/O CHANNEL in a state where the chip select signal CS0 is activated. Furthermore, the storage circuit 420 includes a second register 412 configured to store the impedance setting of the slave chip 322. The impedance setting of the slave chip 322, stored in the second register 412, may be set by decoding signals, which are inputted to the I/O channel I/O CHANNEL in a state where the chip select signal CS1 is activated.

The impedance control circuit 420 is configured to transfer the impedance setting CODE1<0:N> of the master chip 321, which is stored in the first register 411, to the termination circuit 341 when the termination signal ODT0 is activated, and transfer the impedance setting CODE2<0:N> of the slave chip 322, which is stored in the second register 412, to the termination circuit 341 when the termination signal ODT1 is activated. Furthermore, when both of the termination signals ODT0 and ODT1 are activated, the impedance control circuit 420 transfers an impedance value, which is obtained by parallel-computing the impedance setting CODE1<0:N> that is stored in the first register 411 and the impedance setting CODE2<0:N> that is stored in the second register 412, to the termination circuit 341. Thus, the impedance control circuit 420 transfers an impedance setting that corresponds to a termination signal to the termination circuit 341 when only the termination signal is activated, and transfers a parallel impedance value of impedance setting values that correspond to a plurality of termination signals to the termination circuit 341 when the plurality of termination signals are activated.

The termination circuit 341 is enabled when one or more of the termination signals ODT0 and ODT1 are activated, and terminates the I/O channel I/O CHANNEL. At this time, an impedance value of the termination circuit 341 is decided by the impedance setting CODE_OUT<0:N>, which is transferred by the impedance control circuit 420.

Table 1 shows an operation of the termination circuit 341 when the impedance setting of the master chip 321 is set to 120Ω, and the impedance setting of the slave chip 322 is set to 60Ω.

TABLE 1

|  | ODT0 | ODT1 | Termination circuit 341 |
| --- | --- | --- | --- |
| Case 1 | Activated | Deactivated | Terminates I/O channel to 120Ω |
| Case 2 | Deactivated | Activated | Terminates I/O channel to 60Ω |
| Case 3 | Activated | Activated | Terminates I/O channel to 40Ω |
| Case 4 | Deactivated | Deactivated | No termination operation |

FIGS. 3 and 4 illustrate that one master chip 321 and one slave chip 322 are included in the package 320. However, a plurality of slave chips may be provided in the package 320. In this case, the storage circuit 410 of the master chip 321 stores impedance setting values for the respective slave chips, and the master chip 321 performs a termination operation by using an impedance setting that corresponds to a chip whose termination operation is indicated. Furthermore, when termination operations are indicated for a plurality of chips, impedance settings that correspond to chips whose termination operations are indicated are parallel computed, and the master chip 321 performs a termination operation by using the computed impedance value.

Figure 5:
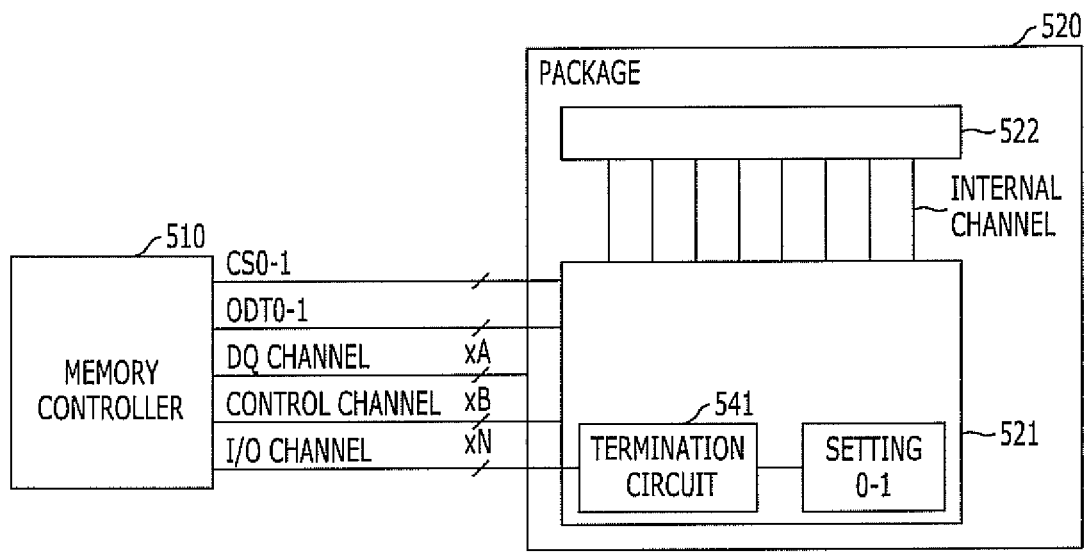
FIG. 5 is a configuration diagram of a memory system in accordance with another embodiment of the present invention.

FIG. 5 is a configuration diagram of a memory system in accordance with another embodiment of the present invention.

Referring to FIG. 5, the memory system includes a memory controller 510, a memory package 520, a data channel DQ CHANNEL, and a control channel CONTROL CHANNEL.

The memory controller 510 is a chip to control memories 521 and 522 in the package 520. The memory controller 510 may be included in a chip on a main board of a PC, a CPU, a GPU, or a mobile device.

The chips 521 and 522 in the memory package 520 are divided into the master memory chip 521 and the slave memory chip 522. The master memory chip 521 directly exchanges signals with the memory controller 510, but the slave memory chip 522 does not directly exchange signals with the memory controller 510. The slave memory chip 522 exchanges signals with the memory controller 510 through the master memory chip 521. The slave memory chip 522 and the master memory chip 521 are interfaced through an internal channel INTERNAL CHANNEL in the package. As illustrated in FIG. 5, the slave memory chip 522 may be stacked over the master memory chip 521, and the internal channel INTERNAL CHANNEL interfacing the slave memory chip 522 and the master memory chip 521 may be formed with a TSV. Between the master memory chip 521 and the slave memory chip 522, a memory chip to be accessed by the memory controller 510 is selected by a chip select signal CS0 or CS1. When the chip select signal CS0 is activated, the memory controller 510 reads or writes data from/into the master memory chip 521. When the chip select signal CS1 is activated, the memory controller 510 reads or writes data from/into the slave memory chip 522.

Between the controller chip 510 and the memory package 520, a data channel DQ CHANNEL and a control channel CONTROL CHANNEL are provided to transmit and receive data. The data channel DQ CHANNEL, through which data are transferred, is connected only to the master memory chip 521. The control channel CONTROL CHANNEL, through which a command and an address are transferred, is also connected only to the master memory chip 521. FIG. 5 illustrates that the data channel DQ CHANNEL has A lines and the control channel CONTROL CHANNEL has B lines.

The master memory chip 521 stores both an impedance setting of the master memory chip 521 and an impedance setting of the slave memory chip 522. When a termination operation of the master memory chip 521 is indicated, that is, when a termination signal ODT0 is activated, the termination circuit 541 of the master memory chip 521 terminates the data channel DQ CHANNEL to the impedance setting of the master memory chip 521. Furthermore, when a termination operation of the slave memory chip 522 is indicated, that is, when a termination signal ODT1 is activated, the termination circuit 541 of the master memory chip 521 terminates the data channel DQ CHANNEL for the impedance setting of the slave memory chip 522. Furthermore, when the termination operation of the master memory chip 521 and the termination operation of the slave memory chip 522 are indicated at the same time, that is, when the termination signals ODT0 and ODT1 are activated at the same time, the termination circuit 541 of the master memory chip 521 terminates the data channel DQ CHANNEL for an impedance value obtained by parallel computing the impedance setting of the master memory chip 521 and the impedance setting of the slave memory chip 522.

In accordance with the embodiment of FIG. 5, only the master memory chip 521 performs a termination operation on the data channel DQ CHANNEL. However, the master memory chip 521 may terminate the data channel DQ CHANNEL for the impedance setting of the master memory chip 521, may terminate the data channel DQ CHANNEL for the impedance setting of the slave memory chip 522, and may terminate the data channel DQ CHANNEL for the parallel impedance value of the impedance setting value of the master memory chip 521 and the impedance setting value of the slave memory chip 522.

Figure 6:
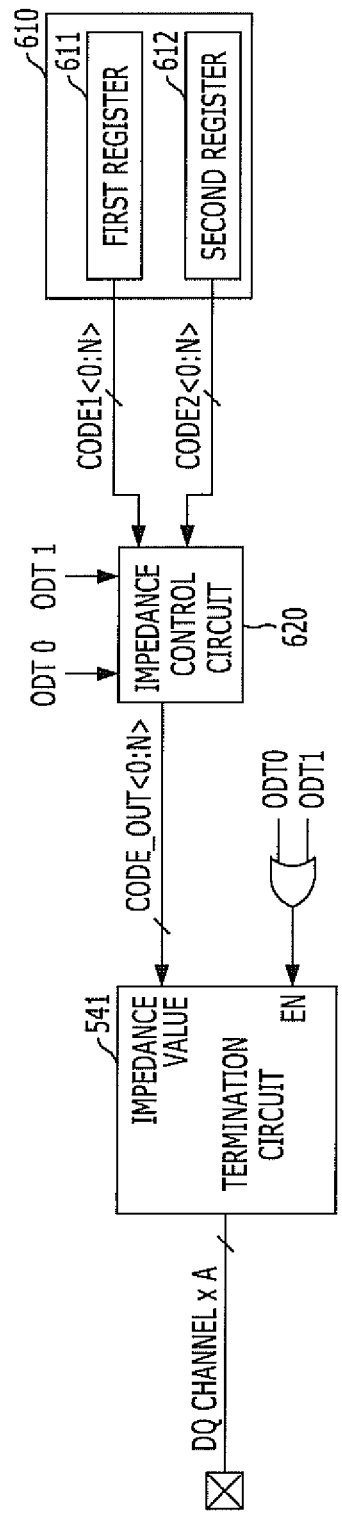
FIG. 6 is a diagram explaining a termination operation of a master memory chip of FIG. 5.

FIG. 6 is a diagram explaining the termination operation of the master memory chip 521 of FIG. 5.

Referring to FIG. 5, the master memory chip 521 includes a storage circuit 610, an impedance control circuit 620, and a termination circuit 541.

The storage circuit 610 is configured to store the impedance setting of the master memory chip 521 and the impedance setting of the slave memory chip 522. The storage circuit 610 includes a first register 611 configured to store the impedance setting of the master memory chip 521. The impedance setting of the master memory chip 521, which is stored in the first register 611, may be set by decoding a command and an address, which are received through the control channel CONTROL CHANNEL in a state where the chip select signal CS0 is activated. FIG. 5 does not illustrate a decoder. Furthermore, the storage circuit 610 includes a second register 612 configured to store the impedance setting of the slave memory chip 522. The impedance setting of the slave memory chip 522, which is stored in the second register 612, may be set by decoding a command and an address which are received through the control channel CONTROL CHANNEL in a state where the chip select signal CS1 is activated.

The impedance control circuit 620 is configured to transfer the impedance setting CODE1<0:N> of the master memory chip 521, which is stored in the first register 611, to the termination circuit 541 when the termination signal ODT0 is activated, and transfer the impedance setting CODE2<0:N> of the slave memory chip 522, which is stored in the second register 612, to the termination circuit 541 when the termination signal ODT1 is activated. Furthermore, when both of the termination signals ODT0 and ODT1 are activated, an impedance value obtained by parallel computing the impedance setting CODE1<0:N> that is stored in the first register 611 and the impedance setting CODE2<0:N> that is stored in the second register 612 is transferred to the termination circuit 541.

The termination circuit 541 is enabled when one or more of the termination signals ODT0 and ODT1 are activated, and terminates the data channel DQ CHANNEL. At this time, the impedance value of the termination circuit 541 is decided by the impedance setting CODE_OUT<0:N> that is transferred by the impedance control circuit 620. FIG. 6 illustrates that the termination circuit 541 terminates only the data channel DQ CHANNEL. However, the termination circuit 541 may terminate the control channel CONTROL CHANNEL as well as the data channel DQ CHANNEL.

The operation of the termination circuit 541 may be performed in the same manner as Table 1.

Figure 7:
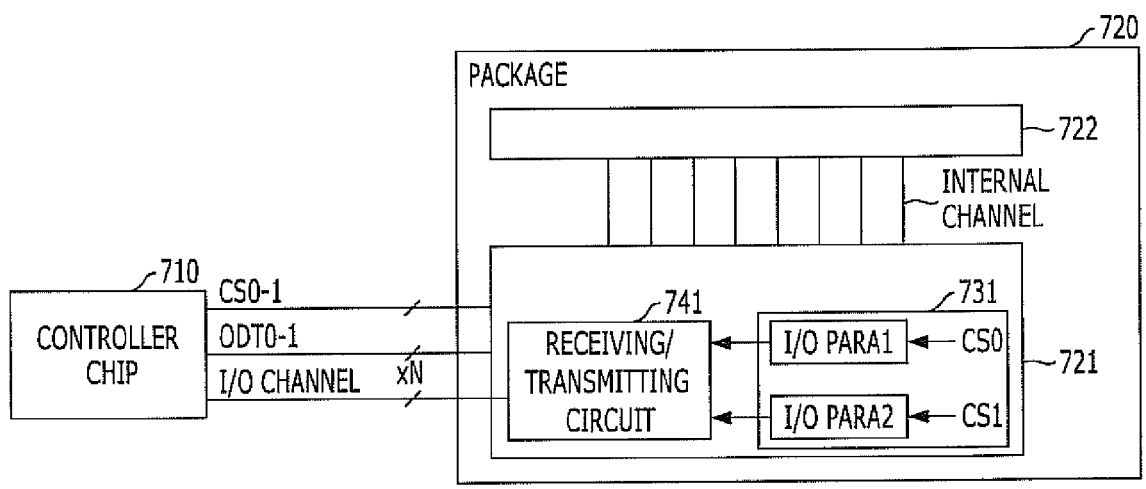
FIG. 7 is a configuration diagram of an integrated circuit system in accordance with another embodiment of the present invention.

FIG. 7 is a configuration diagram of an integrated circuit system in accordance with another embodiment of the present invention.

In the integrated circuit system of FIG. 7, a master chip 721 in a package 720 stores its I/O parameter I/O PARA1 and an I/O parameter I/O PARA2 of a slave chip, and applies the parameters to a receiving/transmitting circuit 741 based on a condition.

Referring to FIG. 7, the integrated system includes a controller chip 710 and a semiconductor package 720 having a master chip 721 and a slave chip 722.

The controller chip 710 is a controller to control the chips 721 and 722 in the package 720. The chips 721 and 722 perform specific operations based on the control of the controller chip 710. For example, the controller chip 710 may include a memory controller, and each of the chips 721 may include a memory.

The chips 721 and 722 in the package 720 are divided into the master chip 721 and the slave chip 722. The master chip 721 directly exchanges signals with the outside of the package 720, but the slave chip 722 does not directly exchange signals with the outside of the package 720. The slave chip 722 exchanges signals with the outside of the package 720 through the master chip 721. The slave chip 722 and the master chip 721 are interfaced through an internal channel INTERNAL CHANNEL in the package 720. As illustrated in FIG. 7, the slave chip 722 may be stacked over the master chip 721, and the internal channel INTERNAL CHANNEL interfacing the slave chip 722 and the master chip 721 may be formed with a TSV. Between the master chip 721 and the slave chip 722, a chip to exchange signals with the controller chip 710 is selected by a chip select signal CS0 or CS1. When the chip select signal CS0 is activated, the master chip 721 exchanges signals with the controller chip 710. When the chip select signal CS1 is activated, the slave chip 722 exchanges signals with the controller chip 710 through the master chip 721.

Between the controller chip 710 and the package 720, an I/O channel I/O CHANNEL is provided to transmit and receive signals. The I/O channel I/O CHANNEL is connected only to the master chip 721 of the chips 721 and 722 in the package 720. The master chip 721 performs a communication with the controller chip 710 and a communication between the slave chip 722 and the controller chip 710, through the I/O channel I/O CHANNEL.

The master chip 721 includes a storage circuit 731 and a receiving/transmitting circuit 741. The storage circuit 731 is configured to store an I/O parameter I/O PARA1 of the master chip 721 and an I/O parameter I/O PARA2 of the slave chip 722. The storage circuit 731 transfers the I/O parameter I/O PARA1 of the master chip 721 to the receiving/transmitting circuit 741, when the chip select signal CS0 is activated, that is, when the master chip 721 exchanges its signals with the controller chip 710. Furthermore, the storage circuit 731 transfers the I/O parameter I/O PARA2 of the slave chip 722 to the receiving/transmitting circuit 741, when the chip select signal CS1 is activated, that is, when the master chip 721 exchanges signals of the slave chip 722 with the controller chip 710. The receiving/transmitting circuit 741 is configured to receive/transmit signals to/from the controller chip 710 using the I/O parameter I/O PARA1 or I/O PARA2 transferred from the storage circuit 731. Here, the I/O parameter may include a setting in signal transmission and reception between the controller chip 710 and the chips 721 and 722. Representative examples of the setting may include latency. For example, read latency, write latency and so on may be set between a memory controller and a memory. Such latencies may be included in the I/O parameters.

In accordance with the embodiment of FIG. 7, only the master chip 721 exchanges signals with the controller chip 710. However, when the master chip 721 exchanges its signals with the controller chip 710, the receiving/transmitting circuit 741 receives/transmits signals using the I/O parameter I/O PARA1 of the master chip 721, and when the master chip 721 exchanges signals of the slave chip 722 with the controller chip 710, the receiving/transmitting circuit 741 receives/transmits signals using the I/O parameter I/O PARA2 of the slave chip 722. That is, although only the master chip 721 receives/transmits signals to/from the controller 710, the two chips 721 and 722 may receive/transmit signals to/from the controller chip 710 using different I/O parameters I/O PARA1 and I/O PARA2.

In accordance with the embodiments of the present invention, even when a master chip and a slave chip are provided in a package, termination resistance values of the master chip and slave chip may be separately set. Through a combination of the master chip and the slave chip, various termination resistance values may be set.

While the present invention has been described with respect to the specific embodiments, it will be apparent to those skilled in the art that various changes and modifications may be made without departing from the spirit and scope of the invention as defined in the following claims.

What is claimed is:

1. A semiconductor package comprising:
  a master chip and a slave chip in communication with the master chip, the master chip including:
    a storage circuit configured to store an impedance setting of the master chip and an impedance setting of the slave chip, and
    a termination circuit to match an impedance value external to the semiconductor to the impedance setting of the master chip or the slave chip,
  wherein, if a termination operation for the slave chip is activated, then the termination circuit is to match the impedance value external to the semiconductor package to the impedance setting of the slave chip.

2. The semiconductor package of claim 1, wherein, if a termination operation for the master chip is activated, then the termination circuit is to match the impedance value external to the semiconductor package to the impedance setting of the master chip.

3. The semiconductor package of claim 2, wherein the master chip further comprises:
  an impedance control circuit configured to:
    receive the impedance setting of the master chip and the impedance setting of the slave chip, and
    generate an impedance value based on the impedance setting of the master chip and the impedance setting of the slave chip,
  wherein, if the termination operation for the master chip and the termination operation for the slave chip are activated at the same time, then the termination circuit is to match the impedance value external to the semiconductor package to the impedance value generated by the impedance control circuit.

4. The semiconductor package of claim 3, wherein the master chip exchanges signals with the outside of the semiconductor package, for the master chip and the slave chip.

5. A semiconductor package comprising:
a master chip and a plurality of slave chips in communication with the master chip, the master chip including:
a storage circuit configured to store an impedance setting of the master chip and impedance settings of the plurality of slave chips, and
a termination circuit to match an impedance value external to the semiconductor package to the impedance setting of the master chip or of a slave chip of the plurality of slave chips and an outside of the package,
wherein, if a termination operation for a slave chip, of the plurality of slave chips, is activated, then the termination circuit is to match the impedance value external to the semiconductor package to the impedance setting of the slave chip.

6. The semiconductor package of claim 5, wherein, if a termination operation of the master chip is activated, the termination circuit of the master chip is to match the impedance value external to the semiconductor package to the impedance setting of the master chip.

7. The semiconductor package of claim 6, wherein the master chip further comprises:
an impedance control circuit configured to:
receive the impedance setting of the master chip and the impedance settings of the plurality of slave chips, and
generate an impedance value based on impedance values of the slave chips, of the plurality of slave chips, whose termination operations have been activated,
wherein, if termination operations for two or more of the plurality of slave chips have been activated at the same time, then the termination circuit is to match the impedance value external to the semiconductor package to the impedance value generated by the impedance control circuit.

8. The semiconductor package of claim 7, wherein the impedance control circuit is to generate the impedance value via parallel-computing.

9. The semiconductor package of claim 5, wherein the master chip exchanges signals with the outside of the semiconductor package, for the master chip and the slave chips.

10. A semiconductor package comprising:
a master chip;
a slave chip; and
a channel configured to interface the master chip and the slave chip,
wherein the master chip comprises:
a storage circuit configured to store an I/O parameter for the master chip and an I/O parameter for the slave chip; and
a receiving/transmitting circuit configured to receive/transmit data of the master chip and data of the slave chip, transferred through the channel, to/from the outside of the semiconductor package, and
wherein the receiving/transmitting circuit receives/transmits data using the I/O parameter for the slave chip when receiving/transmitting the data of the slave chip to/from the outside of the semiconductor package.

11. The semiconductor package of claim 10, wherein the receiving/transmitting circuit receives/transmits data using the I/O parameter of the master chip, when receives/transmits the data of the master chip to/from the outside of the semiconductor package.

12. The semiconductor package of claim 10, wherein both the master chip and the slave chip comprise a memory device, and
the I/O parameter comprises read latency.

13. A memory system comprising:
a memory controller;
a memory package comprising a master memory chip, a slave memory chip, and an internal channel for interfacing the master memory chip and the slave memory chip;
a data channel between the memory controller and the memory package; and
a control channel between the memory controller and the memory package,
wherein the master memory chip comprises:
a storage circuit configured to store an impedance setting of the master memory chip and an impedance setting of the slave memory chip; and
a termination circuit configured to terminate the data channel for an impedance matching operation, and
wherein, if the memory controller activates a termination operation of the slave memory chip, then the termination circuit of the master memory chip terminates the data channel for the impedance matching operation for the slave memory chip.

14. The memory system of claim 13, wherein if the memory controller activates a termination operation of the master memory chip, the termination circuit of the master memory chip terminates the data channel for the impedance matching operation for the master memory chip.

15. The memory system of claim 14, wherein the master memory chip further comprises an impedance control circuit configured to receive the impedance setting for the master memory chip and the impedance setting for the slave memory chip and generate an impedance value obtained by parallel-computing the received values, and
wherein, if the termination operations for the master memory chip and the slave memory chip are activated at the same time, then the termination circuit of the master memory chip performs an impedance matching operation using the impedance value generated by the impedance control circuit.

16. The memory system of claim 13, wherein the data channel and the control channel are connected to the master memory chip, and the master memory chip exchanges signals with the memory controller through the data channel and the control channel.

17. A semiconductor package comprising:
a slave chip in communication with a controller chip via an input/output (I/O) channel; and
a master chip in communication with the slave chip via an internal channel, and in communication with the controller chip via the I/O channel, the master chip including:
a memory to store an impedance setting of the master chip and an impedance setting of the slave chip, and
a termination circuit to:
terminate the I/O channel to an impedance value of the master chip, in response to a first signal, from the controller chip, to terminate an operation of the master chip, and
terminate the I/O channel to an impedance value of the slave chip, in response to a second signal, from the controller chip, to terminate an operation of the slave chip.

18. A method of matching an impedance value of a semiconductor package, including a master chip, and a slave chip in communication with the master chip, the method comprising:

storing, in a memory of the master chip, an impedance value of the master chip and an impedance value of a slave chip;
identifying, via a control chip, that an operation of the slave chip is to be terminated;
terminating, via a termination circuit of the master chip, the operation of the slave chip, in response to a signal from the control chip; and
performing, via the termination circuit, an impedance matching operation to match an impedance value external to the semiconductor package to the impedance value of the slave chip.

* * * * *